United States Patent [19]

Pier et al.

[11] Patent Number: 5,078,803
[45] Date of Patent: Jan. 7, 1992

[54] SOLAR CELLS INCORPORATING TRANSPARENT ELECTRODES COMPRISING HAZY ZINC OXIDE

[75] Inventors: David N. Pier, Agoura; Charles F. Gay, Northridge, both of Calif.; Robert D. Wieting, Munich, Fed. Rep. of Germany; Heidi J. Langeberg, Covington, La.

[73] Assignee: Siemens Solar Industries L.P., Camarillo, Calif.

[21] Appl. No.: 411,148

[22] Filed: Sep. 22, 1989

[51] Int. Cl.⁵ ............................................. H01C 31/06
[52] U.S. Cl. .................................. 136/256; 136/260; 136/262; 136/264; 136/265; 357/30; 357/65; 357/67; 357/71
[58] Field of Search ............... 136/256, 260, 262, 264, 136/265; 357/30 J, 30 Q, 65, 67, 71

[56] References Cited

U.S. PATENT DOCUMENTS

| | | | |
|---|---|---|---|
| 3,655,429 | 4/1972 | Deklerk | 427/100 |
| 4,166,919 | 9/1979 | Carlson | 136/257 |
| 4,335,266 | 6/1982 | Mickelsen et al. | 136/260 |
| 4,450,316 | 5/1984 | Hamakawa et al. | 136/256 |
| 4,461,922 | 7/1984 | Gay et al. | 136/249 TJ |
| 4,465,575 | 8/1984 | Love et al. | 204/192.26 |
| 4,497,974 | 2/1985 | Deckman et al. | 136/259 |
| 4,500,743 | 2/1985 | Hayashi et al. | 136/258 AM |
| 4,518,815 | 5/1985 | Yamazaki | 136/244 |
| 4,532,537 | 7/1985 | Kane | 357/30 |
| 4,554,727 | 11/1985 | Deckman et al. | 437/2 |
| 4,581,108 | 4/1986 | Kapur et al. | 204/37.1 |
| 4,599,482 | 7/1986 | Yamazaki | 136/259 |
| 4,611,091 | 9/1986 | Choudary et al. | 136/260 |
| 4,612,411 | 9/1986 | Wieting et al. | 136/265 |
| 4,623,601 | 11/1986 | Lewis et al. | 430/69 |
| 4,638,111 | 1/1987 | Gay | 136/249 TJ |
| 4,689,438 | 8/1987 | Fukatsu et al. | 136/256 |
| 4,694,116 | 9/1987 | Hayashi et al. | 136/256 |
| 4,732,621 | 3/1988 | Murata et al. | 136/256 |
| 4,746,372 | 5/1988 | Tajika et al. | 136/258 AM |
| 4,751,149 | 6/1988 | Vijayakumar et al. | 428/702 |
| 4,798,660 | 1/1989 | Ermer et al. | 204/192.17 |

FOREIGN PATENT DOCUMENTS 32847 7/1981 European Pat. Off. .... 136/258 AM
WO8809265 12/1988 PCT Int'l Appl. ................. 136/256

OTHER PUBLICATIONS

C. Eberspacher et al., *Thin Solid Films*, vol. 136, pp. 1-10 (1986).
S. Major et al., *Solar Energy Materials*, vol. 17, pp. 319-327 (1988).
Hawley (ed.), "The Condensed Chemical Dictionary", New York: Van Nostrand Reinhold Company, pp. 34, 268, 269.
Bottenberg, W. R., et al., "Optical Considerations in the Performance of Hybrid Four-Terminal Tandem Photovoltaic Modules", ARCO Solar, Inc. Research and Development External Publication No. 88-11,1988.

(List continued on next page.)

Primary Examiner—Aaron Weisstuch
Attorney, Agent, or Firm—Nilsson, Robbins, Dalgarn, Berliner, Carson & Wurst

[57] ABSTRACT

Transparent conductors for use in a variety of different photovoltaic devices are disclosed, comprising at least one ZnO transparent conductor layer having a predetermined level of haziness achieved, e.g., through appropriate variation in the parameters employed in formation of the transparent conductor (for example, by chemical vapor deposition) and/or through treatment of the transparent conductor subsequent to its formation. The concentration and/or relative rate of introduction of dopant during the deposition of the transparent conductor may be adjusted to prepare films having the desired morphology and/or structure. Alternatively, the morphology, composition and/or structure of the transparent conductor may be modified by suitable post-formation treatments. A combination of at least two transparent layers may also be employed, comprising at least a first layer designed primarily to maximize the optical properties and at least a second layer designed to maximize the electrical properties.

25 Claims, 4 Drawing Sheets

| INTEGRATED SHORT CIRCUIT CURRENT DENSITY (mA/cm²) | $B_2H_6$ FLOW | THICKNESS ($\mu m$) | SHEET ($\Omega/\square$) |
|---|---|---|---|
| 41.12 | 5 | ~1.3 | ~100 |
| 38.95 | 10 | ~1.3 | ~18 |
| 33.60 | 20 | ~1.3 | ~9.5 |
| 28.70 | 40 | ~1.3 | ~8.0 |
| 29.44 | 80 | ~1.3 | ~1.3 |

OTHER PUBLICATIONS

Deckman, H. W., et al., "Optical Enhancement of Solar Cells", 17th Photovoltaic Specialists Conference 955-960 (1984).

Derrick, G. H. et al., "Textured Amorphous Silicon Solar Cells", in *Intersol 85: Proceedings of the Ninth Biennial Congress of the International Solar Energy Society*, 1568-1572 (eds., Bilgen, E. and Hollands, K. G. T., 1985).

Han, M-K, et al., *J. Appl. Phys.*, 52(4), 3073-3075, 1981.

Iida, H. et al., *IEEE Electron Device Letters*, 5(3), 65-67 (1984).

Iida, H. et al., *IEEE Electron Device Letters* 4 (5), 157-159, 1983.

Iida, H. et al., *IEEE Electron Device Letters* 3 (5), 114-116, 1982.

Iida, H. et al., *IEEE Transactions on Electron Devices*, 34 (2), 271-276, 1987.

Iida, H., et al., *Technical Digest of the International PVSEC*-1, Kobe, Japan, "Structure of Tin Oxide Films and a Si:H Solar Cell Characteristics", pp. 163-166.

Misonou, M. et al., "Effect of the Texturized Substrate on the Performance on a Si:H Solar Cells", 18*th IEEE Photovoltaic Specialists Conference*, pp. 925-928, 1985.

Mitchell, K., et al., "Single and Tandem Junction CuInSe$_2$ Cell and Module Technology", ARCO Solar, Inc. Research and Development External Publication No.: 88-8, 1988.

Mitchell, K., et al., "7.3% Efficient CuInS$_2$ Solar Cell", ARCO Solar, Inc., Research and Development External Publications, No. 88-9, 1988.

Mizuhasi, M., "Texture Morphology and Cell Reflectance".

Mizuhashi, M. et al., *Japanese J. Appl. Phys.* 27 (11), 2053-2061, 1988.

Sites, J., et al., "Reflection Loss From Polycrystalline CuInSe$_2$ Solar Cells", 19*th IEEE Photovoltaic Specialists Conf.* (1987), pp. 818-822.

C. Eberspacher et al, *Proc. 17th IEE Photovoltaic Specialists Conference*, Kissime, Fl., May 1-4, 1984, pp. 459-463.

H. Schade and Z. E. Smith, "Optical Properties and Quantum Efficiency of a-SI$_{1-x}$C$_x$:H/a-SI:H Solar Cells", *J. Appl. Phys.*, vol. 57, pp. 568-574 (1985).

S. Major, A. Banerjee and K. L. Chopra, "Highly Transparent and Conducting Indium-Doped Zinc Oxide Films by Spray Pyrolysis", *Thin Solid Films*, vol. 108, pp. 333-340 (1983).

SOLAR CELLS INCORPORATING TRANSPARENT ELECTRODES COMPRISING HAZY ZINC OXIDE

BACKGROUND OF THE INVENTION

This invention relates to the use of hazy zinc oxide in the preparation of photovoltaic devices. In particular, this invention relates to the use of a hazy zinc oxide composition in a single conductive layer or in combination with other conductor layers in the preparation of thin film solar cells and modules.

In view of the significant costs associated with the early single-crystal silicon solar cells, a substantial amount of research has been devoted to the use of alternative semiconductor materials. One widely adopted alternative has been the use of thin films of silicon-hydrogen alloys (TFS) in either microcrystalline or amorphous form and including other components such as hydrogen, nitrogen, carbon, germanium, tin, etc. In addition, a variety of binary, ternary and quaternary semiconductor compounds have been widely employed in the preparation of photovoltaic devices; combinations of particular interest include II/VI, III/V, I/III/VI and II/IV/V compounds.

A particularly valuable ternary semiconductor compound for use in photovoltaic devices is the I/III/VI compound copper indium diselenide ($CuInSe_2$ or CIS). This compound has high optical absorption coefficients over much of the solar spectrum and can absorb 90% of the useful solar spectrum in a thickness of less than 1 $\mu$m. Exemplary procedures for preparation of photovoltaic devices including CIS semiconductor layers are reported in U.S. Pat. No. 4,335,266 to Mickelsen et al., U.S. Pat. No. 4,581,108 to Kapur et al. and U.S. Pat. No. 4,465,575 to Love et al., the disclosures of which are hereby incorporated by reference. A method for preparation of a CIS film by DC sputtering first of copper and then of indium using separate cathodes, followed by heating of the composite film in the presence of a gas containing selenium, is taught in U.S. Pat. No. 4,798,660 to Ermer et al. the disclosure of which is also hereby incorporated by reference. A presently preferred method for fabrication of a CIS film is taught in co-pending U.S. application No. 07/273,616 filed Nov. 17, 1988 and assigned to the same assignee as this application, the disclosure of which is also hereby incorporated by reference.

The basic cell structure of a CIS solar cell as disclosed in co-pending U.S. application No. 07/273,616 comprises a ZnO transparent front electrode, a thin CdS interfacial layer, a $CuInSe_2$ absorber layer and a Mo back electrode. The efficiency of such devices and the resulting power density of large-area CIS modules is strongly dependent on a large number of factors, including the effect of the front electrode with respect to cell photocurrent density, module resistive losses and patterning quality.

Integrated thin film solar modules place stringent requirements on the properties of the transparent conductor layers. In thin film cell structures the transparent conductor layer typically acts both as an optical transmitter and as a conducting electrode. As an optical transmitter, the transparent conductor must have high optical transmission over the response spectrum of the absorber semiconductor film, for example, CIS. CIS has an optical bandgap of approximately 1 eV, so that it is essential that the transparent conductor fully transmit the longer-wavelength "red" solar spectrum, requiring that plasma absorption effects be minimal. CIS solar cell structures are typically heterojunction structures capable of being responsive to the shorter-wavelength "blue" solar spectrum, requiring that the transparent conductor have a wide bandgap so as to transmit the shorter-wavelength light. A third optical requirement often desired of the transparent conductor is a suitable index of optical refraction and surface structure so as to minimize optical reflection. Thin film module designs typically lack front current collecting grids; therefore, the sheet resistance of the transparent conductor electrode is substantially more important in modules than in individual gridded solar cells. In particular, the sheet resistance plays an important role in determining the maximum power output achievable for a module. For high power CIS modules in particular, photocurrent densities on the order of 40 $mA/cm^2$ demand high conductance electrodes to minimize resistive losses.

Thin film solar cell structures sometimes address the stringent optical and electrical requirements on the transparent conductors by adding additional optical layers into the cell structure. For example, a common CIS cell structure incorporates a transparent conductor optimized for its conductance and optical clarity, and utilizes a separate anti-reflection layer such as $SiO_x$ to optimize cell photocurrents. The use of separate transparent conductor and anti-reflection layers adds additional complexity and cost to the module fabrication process.

An additional factor which must be considered in optimizing transparent electrodes for solar cell module fabrication is the effect of the electrode film on the electrical interconnects between cells of the module. A low resistance contact from the front electrode of one cell to the back electrode of an adjacent cell is essential. Moreover, the transparent electrode layer should be easily patterned.

ZnO is well-suited for use as the transparent conducting electrode in a thin film solar module. Its optical bandgap of approximately 3.3 eV is wide enough to transmit the shorter-wavelength "blue" solar spectrum. ZnO can be deposited at relatively low temperatures with low lattice damage, for example by the chemical vapor deposition process disclosed in U.S. Pat. No. 4,751,149, the disclosure of which is also hereby incorporated by reference. Low-temperature, low-damage deposition is particularly important for efficient photovoltaic structures incorporating compound semiconductor films with volatile components. ZnO has electronic properties such as electron affinity and work function suitable for making efficient heterojunctions with compound semiconductors, such as CIS. The electrical conduction of ZnO films can be controlled by composition control or by the addition of extrinsic dopants such as H, Al, Ga, In or B. In practical use in thin film solar modules, the optical transmission and the electrical conductance must be simultaneously optimized. It is necessary to balance longer-wavelength plasma absorption due to charged free carriers against the higher conductance of high free carrier density. In CIS solar cells and modules, transparent conductor layers of materials such as ZnO doped with B, Al and/or H have heretofore been reported to provide a reasonable balance of transparency and conductivity. Typically, conductivity of these layers is maximized while minimizing optical transmission losses so as to maximize conversion efficiency of the cell or module to make the use thereof economically feasible.

It is known that the efficiency of photovoltaic devices comprising TFS semiconductor films may be increased through the exploitation of light trapping by internal reflection of scattered radiation in the semiconductor films themselves. Deckman et al. provide an optical enhancement model for describing the improved infrared absorption probability in TFS textured semiconducting sheets relative to flat sheets [Deckman, H.W. et al., "Optical Enhancement of Solar Cells," 17 IEEE Photovo Haic Specialist Conference" 955-960 (984)]. The magnitude of the photogenerated current is reportedly determined by several factors, including the optical properties of the electrical contacts. Increases in photogenerated current observed are described as comprising both optical enhancement and antireflection components.

Conversion efficiency of TFS solar cells has been found to have a close relation to the grain size of tin oxide transparent electrodes employed in glass substrate/transparent electrode/p-i-n/back electrode-type solar cells [Iida, N. et al., "Efficiency of the H Solar Cell and Grain Size of $SnO_2$ Transparent Conductive film," IEEE Electron Device Letters *EDL*-4(3); 157-9 (1983)]. The observed increase in photocurrent density at short-circuit $J_{sc}$ and decrease reflectivity were both believed to be caused by light trapping in the large grain $SnO_2$ film and adjacent TFS semiconductor layer. The conversion efficiency and short-circuit current of cells comprising such "milky tin oxide on glass" (MTG) substrates were subsequently reported as comparable to those of conventional thicker i-layer cells with double layer transparent conductors comprising indium tin oxide layers [Iida, H. et al., "A Milky Tin Oxide on Glass (MTG) Substrate Thin Undoped Layer p-i-n Amorphous Silicon Solar Cell with Improved Stability and Relatively High Efficiency," IEEE Electron Device Letters *EDL*-5(3): 65-7 (1984)].

It has further been reported that the selection of the side to which a texture is applied can have an important effect on the photovoltaic characteristics in TFS solar cells [Iida, H. et al., "The Structure of Natively Textured $SnO_2$ Film and Its Application to an Optical Confinement-Type a-Si:H Solar Cell," IEEE Transactions on Electron Devices *ED*-34(2): 271–6 (1987)]. Application of a textured tin oxide film at the incident light side reportedly gave a more suitable optical confinement effect than a texture treatment at the back side electrode, resulting in an improvement in collection efficiency over the wide wavelength range from 0.3 to 0.8 $\mu$m.

U.S. Pat. No. 4,532,537 to Kane suggests a photodetector comprising a light transmissive electrical contact having a textured surface and a semiconductor body overlying the textured surface of the light transmissive electrical contact, wherein the surface texture of the electrical contact is characterized in that it has a dominant peak-to-valley roughness greater than about 100 nanometers. According to the patent, a layer of tin oxide or indium tin oxide is deposited by chemical vapor deposition (CVD) onto a heated substrate; the higher the temperature at which the deposition occurs, the greater the texture, provided that the temperature is less than the temperature at which the substrate softens.

U.S. Pat. No. 4,732,621 to Murata et al. describes a process in which a uniform transparent conductive oxide layer comprising indium tin oxide (ITO) doped with 5 weight-% $SnO_x$ is deposited to a predetermined thickness and then etched using a concentrated chemical etchant in order to make the surface of the transparent conductor rough. The thus-treated ITO layer is described as having a decreased, substantially constant reflectance throughout the visible light range.

Various U.S. patents describe TFS solar cells in which indium and/or tin oxide transparent conductor layers having a specified structure are incorporated. Thus, U.S. Pat. No. 4,746,372 to Tajika al. suggests a conductive transparent film which has micro-columns or fine crystals formed at least on one surfaoe thereof at 500 to 2000 Anqstroms in height. U.S. Pat. No. 4,694,116 describes a transparent electrode comprising two superimposed layers which are separately deposited on a transparent substrate, the average grain diameter of the second layer being smaller than the average grain diameter of the crystal grains of the first layer; any sharp protrusions at the surface of the first layer are effectively rounded by the provision of the second layer thereon formed of crystal grains with a relatively small average grain diameter. U.S. Pat. No. 4,500,743 to Hayashi et al. describes a transparent electrode wherein the average grain diameter of the surface ranges from 0.1 to 2.5 $\mu$m. U.S. Pat. No. 4,689,438 to Fukatsu et al. describes a transparent conductor layer wherein the surface is textured in the form of a large number of triangular or quadrangular pyramids having a height of about 1,000 to 3,000 Angstroms and a pitch of about 1,000 to 3,000 Angstroms.

It is an object of the present invention to provide improved transparent conductors for use in the preparation of a variety of photovoltaic devices, such as solar cells and modules.

It is a further object of the present invention to provide photovoltaic devices with optimum solar energy conversion efficiencies.

It is yet another object of the present invention to provide procedures for the efficient and reproducible preparation of optimal transparent conductors for use in any given photodetector system.

SUMMARY OF THE INVENTION

In accordance with the present invention, it has been determined that transparent conductors comprising zinc oxide which, instead of the heretofore-favored optical clarity, exhibit a milky or cloudy appearance provide an optimum balance of optical and electrical properties for use in the preparation of photovoltaic devices, and in particular solar cells comprising a CIS semiconductor layer. It has surprisingly been found that the enhancement in photocurrent is more pronounced in such CIS devices than is the case with analogous TFS cells.

In accordance with one aspect of the present invention, optimal transparent conductors for use in a variety of different photovoltaic devices are provided comprising zinc oxide having a predetermined level of haziness achieved through appropriate variation in the parameters employed in formation of the transparent conductor (for example, by chemical vapor deposition procedures known per se) and/or through treatment of the transparent conductor subsequent to its formation. In one particularly advantageous embodiment of this first aspect of the invention, the relative rate of introduction of dopant during the deposition of the transparent conductor (for example, by a CVD process) is adjusted to prepare films having the desired morphology and/or structure. Alternatively, the morphology and/or structure of the transparent conductor may be modified by suitable post-formation treatments.

In accordance with another aspect of the present invention, a combination of at least two transparent conductor layers is employed, comprising at least one layer designed primarily to maximize the optical properties of the conductor and at least a second layer designed to maximize the electrical prooperties thereof. In a preferred embodiment of this aspect of the present invention, at least one of these layers comprises a hazy zinc oxide.

BRIEF DESCRIPTION OF THE DRAWIGNS

Figure 1:
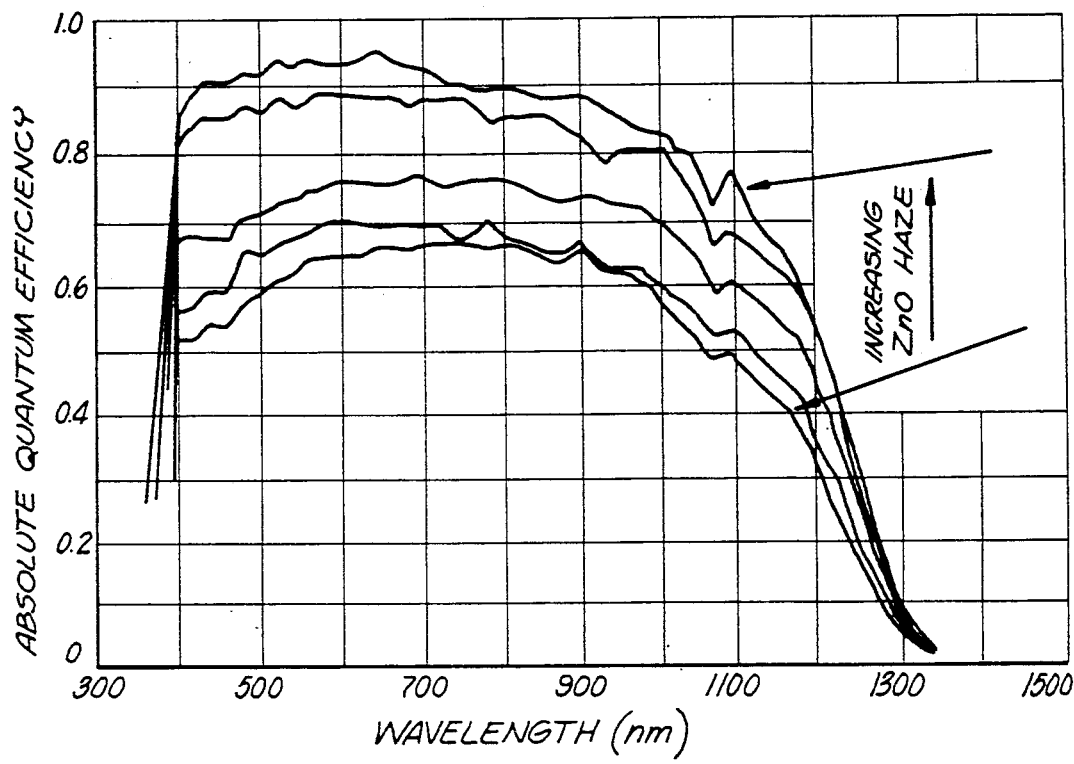
FIG. 1 illustrates the spectral response data obtained for high efficiency solar cells prepared in accordance with one aspect of the present invention as a function of the degree of haze of the ZnO transparent conductor.
Figure 2:
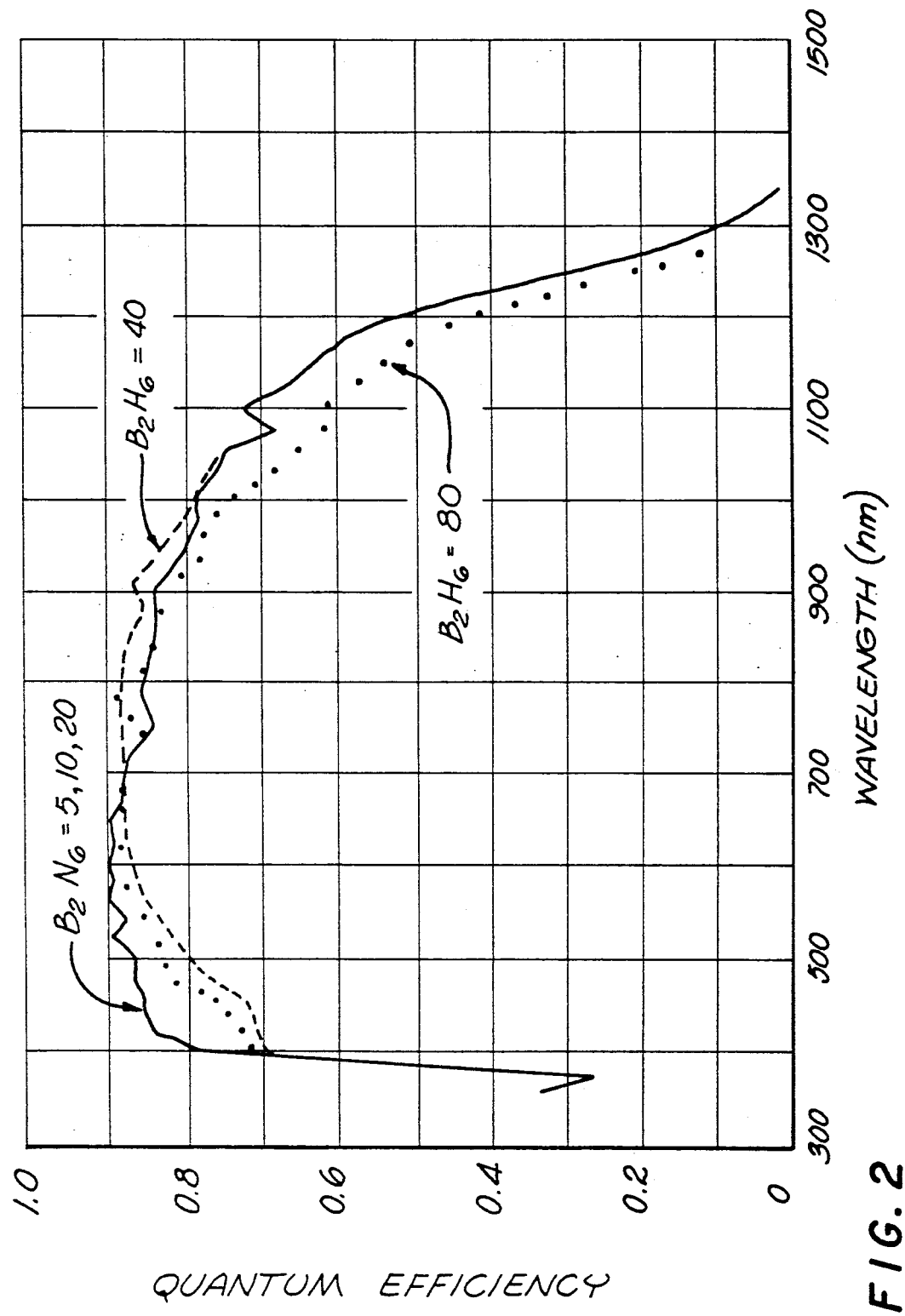
FIG. 2 shows the spectral response curves of FIG. 1 normalized by setting the peak value of each at 90% and rescaling.
Figure 3:
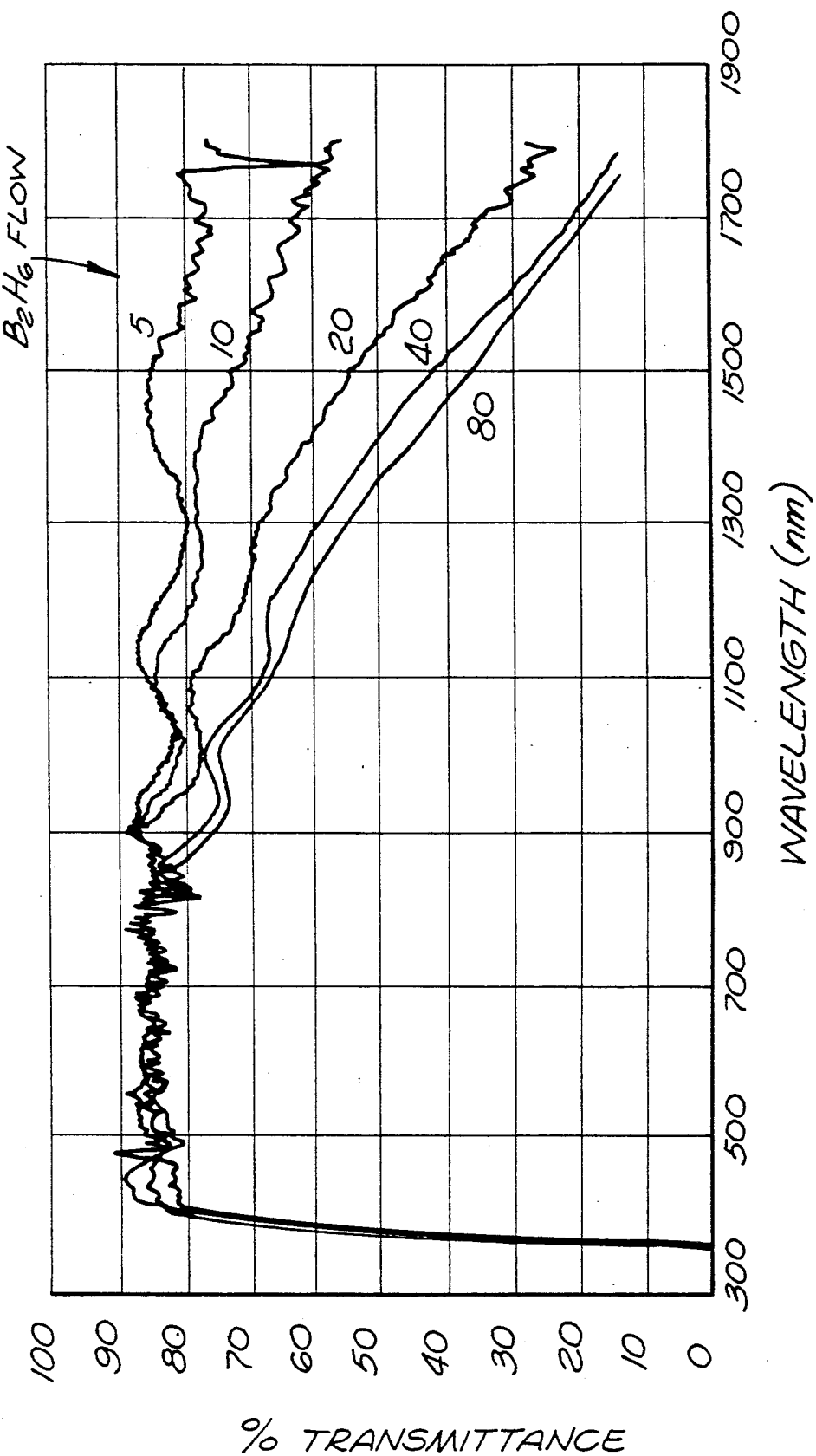

FIG. 3 provides transmission data for ZnO witness plates prepared during deposition of the transparent conductor layers of the high efficiency solar cells referred to in connection with FIGS. 1 and 2.

Figure 4:
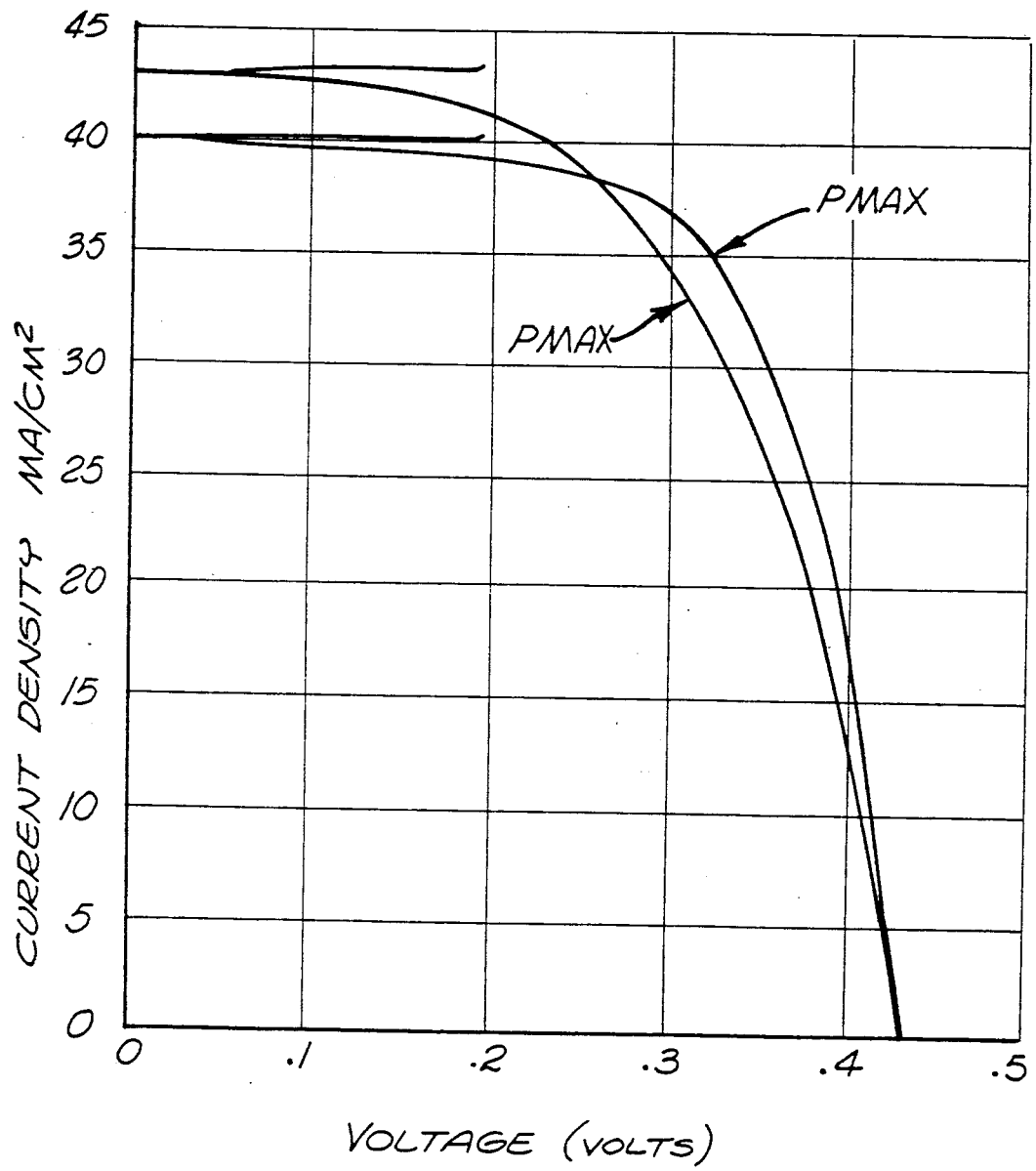

FIG. 4 shows the current-voltage (I–V) curves for solar cells prepared in accordance with one aspect of the present invention.

DETAILED DESCRIPTON OF THE INVENTION

In accordance with a first aspect of the present invention, it has been found that the optical coupling and anti-reflection properties of ZnO transparent conductors in photovoltaic devices, and in particular $ZnO/CdS/CuInSe_2$ based solar cells, depend strongly on the ZnO film morphology and/or structure. By carefully tailoring the process for formation of the ZnO films and/or through appropriate post-formation treatments, it is possible to form films with similar peak optical transmissions and thicknesses, but significantly different morphologies and/or structures. Selection of the appropriate film morphology and/or structure for use in a given photovoltaic device is shown to result in an optimization of significant system parameters, permitting the achievement of heretofore unrealized solar energy conversion efficiencies.

The morphology and/or structure of such transparent conductor films as ZnO may be characterized by the degree of macroscopic "haze" arising from scattering of incident light by the microscopic surface topology and the bulk grain structure. Surprisingly, it has now been determined that dramatic differences in broad band photoresponse and photocurrent density in thin film semiconductor solar cells other than those comprising a TFS layer can be produced as a result of the degree of haziness of otherwise identical ZnO transparent conductor films. In such systems, electrical effects of the type reported in 1987 by Iida et al., supra, as observed at the interface of a $SnO_2$ transparent conductor with a TFS layer would not have been expected. Moreover, due to the strong optical absorption coefficients of many of these other systems, such as CIS, multiple internal reflections as occcur in TFS-based systems are unlikely in the miconductor layer, as the majority of light is bi-lieved to be absorbed in the first pass through the layer. Indeed, the strong optical absorptivity of such semiconductor systems may make them particularly responsive to the light scattering effects of a hazy transparent front electrode due to the increased path length of scattered light through the device's active junction collection region as compared to light passing straight through the device. Even more surprisingly, the magnitude of increase in photocurrent density observed, for example, in CIS systems is substantially greater than has been observed in analogous systems comprising TFS semiconductors and $SnO_2$ electrodes. For example, hazy ZnO on CIS increases the photocurrent density 30% or more relative to specular ZnO on CIS, compared to increases of less than 20% for $SnO_2$-TFS structures. Photocurrent density has been found to increase with increasing transparent conductor film haze; measurements of the quantum efficiencies of ZnO/CdS/CIS cells incorporating hazy ZnO layers, for example, demonstrate that the transparent conductor morphology and/or structure affects the cell photoresponse across the entire optical response band of the junction, suggesting that changes in photocurrent are due to a reduction in front surface reflection and to increased optical scattering by the transparent conductor grain structure. It is further believed that the observed effects are of a general nature; i.e., for any compound semiconductor photovoltaic device without antireflection coatings, inclusion of a ZnO transparent conductor front electrode exhibiting haze results in an increase in collection efficiency of the device.

Thin film solar cells of ZnO/thin $CdS/CuInS_2$ have been fabricated using CVD-deposited ZnO and efficiencies over 7% have been demonstrated [Mitchell, K. et al., "7.3% Efficient $CuInS_2$ Solar Cell," 20th IEEE Photovoltaic Specialists Conference (1988)]. Thin film solar cells of ZnO/thin $ZnSe/CuInSe_2$ have been fabricated using CVD-deposited ZnO and efficiencies of 10% have been demonstrated [Mitchell, K. et al., "Single and Tandem Junction $CuInSe_2$ Cell and Module Technology," 20th IEEE Photovoltaic Specialists Conference (1988)]. Thin film solar cells of ZnO/CdS/-$CuInGaSe_2$ have been fabricated and efficiencies of over 14% have been demonstrated [Mitchell, K. et al., "$CuInSe_2$ Cells and Modules," Special Issue Transactions on Electron Devices on Photovoltaic Materials, Devices and Technologies (in press)]. All of these device structures could benefit from a hazy transparent conductor as disclosed in this application.

In semiconductors a higher concentration of dopant generally results in a higher concentration of charged free carriers. As a consequence, moderately higher dopant concentrations generally result in lower film sheet resistance. In addition, higher dopant concentrations in transparent conductors generally result in a decrease in long-wavelength optical transmission due to a greater degree of free carrier plasma resonance absorption. As a result of these two general trends, in a solar cell incorporating a doped transparent conductor, for example ZnO doped with boron, an increase in the dopant concentration (and thus, in the charged free carrier density) decreases the sheet resistance, but also reduces longer-wavelength optical transmission (e.g., greater than 900 nm).

In one embodiment of the invention wherein the transparent conductor is ZnO doped by a dopant gas (e.g., $B_2H_6$) during the film deposition, it is possible to produce ZnO films having a milky or hazy appearance by reducing the relative dopant flow rate into the deposition chamber. The resultant hazy ZnO transparent conductor layers exhibit both increased transmission at longer wavelengths (due to a decrease in plasma absorption because of the reduced free carrier concentration) and increased antireflective and optical coupling properties (due to the film's morphology and/or structure). Both of these factors work together to increase the electrical photocurrent of devices made using hazy ZnO transparent electrodes. An additional unexpected benefit of this embodiment when used to provide ZnO electrodes for CIS devices has been reduction in mechanical failure (i.e., peeling) of devices made using the hazy ZnO created by reducing the dopant gas flow during ZnO deposition, presumably due to a decrease in the stress of the ZnO film.

This embodiment serves to illustrate a common problem encountered in forming transparent conductor films for use in photovoltaic devices, namely optimizing the deposition parameters to fabricate a film exhibiting the desired optical properties often compromises some other film property important for realizing optimum device conversion efficiencies. In this case, reducing the relative dopant flow rate into the deposition chamber while forming the ZnO film in order to produce a hazy ZnO film increases the sheet resistance of the resultant ZnO film. As the sheet resistance of the ZnO electrode plays a critical role in the maximum power output achievable for a typical cell or module, it is necessary to minimize the electrode's sheet resistance. The sheet resistance of a film is directly related to its thickness and the resistivity of the material (and thus, for a semiconductor, to its dopant concentration). In a ZnO transparent conductor, changes made to alter either of these properties so as to optimize the sheet resistance of the film typically have the opposite effect on the photocurrent of the device comprising the ZnO film. To attain optimum device performance, a compromise between these opposing effects is necessary. This is particularly critical for CIS/thin CdS/ZnO-based modules, where the high device photocurrent densities require very conductive electrodes to carry the high currents produced.

Pursuant to one aspect of the present invention, transparent conductors comprising hazy ZnO films (for example, on the order of 0.75-3 $\mu$m in thickness in the exemplary type of cell described in several of the examples) have been found to provide an optimum balance of optical and electrical properties for use in a variety of photovoltaic devices. In particular, many such films demonstrate particularly advantageous "light trapping" properties, making it possible to achieve very high photocurrent densities. Typical solar cells in accordance with this aspect of the invention have employed hazy 1.5 $\mu$m films with sheet resistances on the order of 20 ohm/sq.

For the purposes of this invention, the term "transparent conductor" is used to describe a thin film having a sheet resistance value useful for fabricating practical photodetector devices and also exhibiting a peak optical transmission of greater than about 75% in the wavelength range to which the photodetector is sensitive. The term "haze" is used to describe the macroscopically observable ability of a film to scatter transmitted light. For the purposes of this invention, "haze" may be defined as the ratio of the diffuse (i.e. scattered) component of transmitted light to the total amount of light transmitted by the transparent conductor film for the wavelengths of light to which the photodetector is sensitive. A "hazy transparent conductor" may thus be defined as a thin film which has a sheet resistance useful for fabricating photodetector devices and which exhibits, over the wavelengths of light to which the photodetector responds, a peak optical transmission greater than 75% and a degree of light scattering ability. In accordance with the present invention, transparent conductor films with a degree of haze of 5% or greater are found to provide enhanced photocollection abilities in photovoltaic devices and are considered "hazy transparent conductors" (the degree of optical coupling varying with the degree of haze of the film). One method to measure haze is with, for example, a Model NDH-20D Digital Haze and Turbidity Meter (manufactured by Nippon Denshoku Kogyo Co., Ltd. of Japan).

Pursuant to a first embodiment of this aspect of the invention, the desired balance of optical and electrical properties is obtained by controlling the relative concentration and/or rate of introduction of dopant gas or vapor during the formation of the zinc oxide layer in a predetermined manner so as to provide a final product having the desired morphology and/or structure while still retaining adequate electrical conductivity. In a typical procedure for preparation of doped zinc oxide layers by chemical vapor deposition, for example, the flow rate of the dopant may be appropriately adjusted relative to the other reactants. Other deposition parameters, such as rate of introduction of reactants, type of reactants, type of dopant, deposition system temperature, deposition pressure and substrate temperature may also be changed to alter the resultant film's morphology and/or structure.

In accordance with another embodiment of this aspect of the invention, the surface of a transparent conductor may be modified so as to increase haze. For example, a ZnO layer may be modified by using oxalic acid so as to form zinc oxalate crystals, which have more volume per zinc atom and form larger grains ($\approx 10$ $\mu$m). Test data on solar cell modules has shown photocurrent increases pursuant to such post-formation treatment, without substantial increases in sheet resistance values. Alternatively, by selection of appropriate concentration and reaction time, the surface of a transparent conductor may be etched using either an acid or a base so as to increase the haze of the transparent conductor film. One base that has been used successfully to increase the haze of a ZnO film is NaOH; for example, soaking in a 1 N solution of NaOH for about 15 minutes results in a significant increase in haze, while changing the thickness and the sheet resistance of the film by only approximately 10%.

While a single hazy zinc oxide layer in accordance with a first aspect of this invention has been found to provide adequate electrical properties for use in preparation of particularly advantageous transparent conductors for many typical solar cell and tandem systems, solar modules place even more stringent demands on the transparent electrode with respect to electrical characteristics. In particular, it is necessary that the sheet resistance of the transparent conductor be as low as possible. One manner in which to reduce the sheet resistance is to increase the dopant concentration. Unfortunately, for transparent conductor layers based on ZnO this decreases the film grain size (i.e., decreases the haze) and the associated "light trapping" effect. In addition, higher dopant concentrations reduce the long wavelength transmission, thereby reducing overall solar energy conversion efficiency.

An alternative method for obtaining lower sheet resistance values is to increase the thickness of the film. For example, increasing the ZnO layer thickness to 3

μm results in a decrease of the sheet resistance to around 5 ohms/sq, with an attendant loss in $Js_{sc}$ of about 1-2 mA/cm$^2$. Moreover, the decreased sheet resistance and associated increased fill factor in a typical module will generally more than compensate for the reduction in the short circuit current. Nonetheless, transparent conductors having such substantially increased thicknesses are not without their own drawbacks, most of which are directly attributable to the increase in thickness.

According to another aspect of the present invention, a further alternative for optimizing performance is therefore provided, whereby instead of increasing the thickness of a single transparent conductor layer, a multiple-layer structure including at least one relatively thin and optimally conductive layer is employed in conjunction with a layer having optimal morphology and/or structure for purposes of obtaining the desired optical properties (i.e., haze). For example, in an exemplary system comprising a 1.5 μm hazy ZnO film having excellent optical properties, a second layer of optimally doped (with respect to its electrical properties) ZnO on the order of 0.5 μm in thickness would be sufficient to provide the system with the necessary electrical properties for use of the cell in, e.g., a module system. In this manner, the same incremental decrease is obtained in sheet resistance as is attendant to, for example, a doubling of the thickness of the film, while the optical properties of the film are maintained or improved relative to the single thicker zinc oxide layer.

In addition to the increase in photocurrent density realized by using hazy ZnO-based transparent conductors, the use of thinner multi-layer transparent conductors allows shorter deposition run times and lower reactor maintenance, thereby reducing the overall cost of module fabrication. A further significant unexpected benefit is a reduction in the width of film cracking and delamination adjacent to the patterning scribe lines used to form the interconnect circuitry between cells of the module. This leads to an overall reduction in the interconnect width, less active area lost to forming interconnects, closer patterning steps and higher system electrical currents. Thinner transparent conductors also can result in a reduction in mechanical stress in the system, leading to an improvement in mechanical durability of the completed module.

In a further embodiment of this aspect of the present invention, a layer of ZnO modified so as to comprise zinc oxalate crystals may be employed as an optically hazy layer in a multi-layer system. In one embodiment, an optimally-doped layer with respect to electrical properties, suitably also comprising ZnO, is superimposed thereon to serve as a conductive layer. It is also possible to apply a layer of zinc oxide or other suitable transparent conductor material over a zinc oxalate crystal layer. Alternatively, it is possible to modify only a portion of a transparent conductor layer so as to introduce haziness in that portion while retaining the original optical and electrical properties in the balance of the layer.

It will be readily apparent to those skilled in the art that a wide range of variations in the described multiple-layer transparent conductor arrangement would be suitable for use in accordance with the present invention. For example, transparent conductors comprising three or more layers are also contemplated as within the scope of this aspect of the invention. Alternatively, it is possible to provide a transparent conductor layer which has a gradient of properties (electrical and optical) across the layer. Other variations in structure are also contemplated as within the scope of the invention, provided that at least one layer or portion thereof has the requisite optical properties (i.e., haze) and at least a second has the desired electrical characteristics.

In this manner, improved module performance may be achieved in accordance with this aspect of the invention by structuring the transparent conductor layer so as to optimize the sheet resistance, transmission and optical coupling capabilities, through the use of a plurality of layers in lieu of a single, essentially uniformly-deposited layer. For example, a hazy ZnO layer may be employed in order to achieve the desired haze effect; a second, optimally doped layer is then added in order to improve the overall sheet resistance.

The present invention in its various aspects may be better understood with reference to the following examples, which are provided for purposes of illustration and which should in no sense be construed as limiting in any way the scope of the appended claims.

EXAMPLE 1

Preparation of Solar Cells Comprising a Hazy ZnO Transparent Conductor

Except as otherwise noted, the apparatus and procedures employed in preparation of the samples described in this and subsequent examples are essentially in accordance with the preparative method disclosed in copending U.S. application Ser. No. 07/273,616. Additional detailed disclosure with respect to apparatus employed in these examples may also be found in U.S. Pat. No. 4,465,575 to Love et al. The zinc oxide layers were deposited using a chemical vapor deposition (CVD) apparatus and process as disclosed in U.S. Pat. No. 4,751,149.

The doping level of a ZnO film deposited in a typical CIS device was varied while keeping the film thickness and other deposition parameters fixed to the extent possible, in order to measure the effect of ZnO doping on long-wavelength photoresponse. The ZnO films were deposited on ten Mo/CIS/thin CdS films with a process history similar to that of the products as described in co-pending application Ser. No. 07/273,616.

Two CIS parts were used in each of five ZnO deposition runs, with seven glass witness plates being included for purposes of monitoring ZnO deposition. The substrates and witness plates were placed in a vacuum chamber of approximately 55 liters in volume on a heated support at about 190° C. The chamber was evacuated and substrate temperature allowed to stabilize for about 10 minutes to approximately 165° C. For a total substrate area of about 900 cm$^2$, the zinc oxide layer was formed by providing reactive gases comprising 70 sccm (standard cubic centimeters per minute) diethyl zinc vapor, 90 sccm H$_2$O vapor and 200 sccm argon. The pressure was held at approximately 0.5 Torr during deposition by throttling the chamber's pumping system. Gas flow of a mixture of 3% B$_2$H$_6$ in He was varied to provide five different dopant concentrations designated as 5, 10, 20, 40 and 80 (corresponding to B$_2$H$_6$ gas flows into the chamber of approximately 0.2, 0.4, 0.8, 1.6 and 3.2 sccm, respectively). Under these conditions, a layer having a thickness of about 1.3 μm was deposited in about 8 minutes process time.

FIG. 1 shows the spectral response data for the highest efficiency cells produced in each of the ZnO runs.

The response of the cells across the entire spectrum varied strongly with doping level. This indicated that the level of dopant in the ZnO layer produced an optical effect on the resultant product. In particular, at low doping levels the ZnO acted as a textured antireflection (AR) coating; at higher doping levels, the layer tended to serve as a reflector and/or absorber. This is consistent with the observation that lower-doped ZnO films appeared more hazy than higher doped ZnO films, and that the product cells appeared visually blacker with the lower-doped films. The integrated photocurrent for the lowest doped film was the highest value that had been observed to that time for a CIS device.

To evaluate the relative effect of varying the ZnO doping level on long-wavelength response, the spectral response curves of FIG. 1 were normalized by setting the peak value of each at 90% and rescaling the rest of the response curve. The results are shown in FIG. 2. Except for the cell wherein the ZnO dopant level is highest, little difference in long-wavelength response is seen among the devices. Moreover, the normalized response curves are essentially identical for the three lowest dopings. This is a further indication that the trends illustrated in FIG. 1 for the integrated photocurrent are due mainly to AR effects.

FIG. 3 shows optical transmission data for the ZnO witness plates from the deposition runs, showing the expected reduction (due to plasma absorption) at longer wavelengths. As this long-wavelength reduction is not reflected in the normalized response curves for the lower dopant levels, the long-wavelength response is apparently not greatly affected at these lower dopant levels by variances in the ZnO plasma absorption.

FIG. 4 shows the I-V curves for the cells produced using the ZnO layers with the two lowest concentrations of dopant. Although the cell with the lowest dopant concentration ($B_2H_6=5$) has the highest photocurrent, overall device performance suffers due to the high sheet resistance ($\approx 100$ ohm/sq) of the lower-doped ZnO. The cell using the second lowest dopant concentration ($B_2H_6=10$) has the best overall performance. In this case, a relatively high $J_{sc}$ was still obtained, yet the ZnO sheet resistance did not greatly depress the fill factor of the device. The short circuit currents ($J_{sc}$), open circuit voltages $V_{oc}$), fill factors (FF) and efficiencies (EFF) for these two cells are reported in Table I.

TABLE I

|  | $B_2H_6 = 5$ | $B_2H_6 = 10$ |
| --- | --- | --- |
| $J_{sc}$ (mA/cm$^2$) | 41.1 | 39.0 |
| $V_{oc}$ (volts) | .436 | .432 |
| FF (%) | 54.6 | 65 |
| EFF (%) | 9.8 | 10.9 |

EXAMPLE 2

Preparation of Solar Cells Comprising a Two-Layer Transparent Conductor

In accordance with the method described in Example 1, 2 μm thick ZnO films comprising a two-layer structure were prepared on witness sheets. The ZnO film comprised a first layer of approximately 1.5 μm thick hazy ZnO and a second layer of optimally-doped ZnO (i.e., $B_2H_6=20$) at a thickness of about 0.5 μm. These two-layer films exhibited sheet resistance values of about 6 ohm/sq and transmissions similar to typical 3 μm thick films.

Two modules comprising such two-layer structures were also prepared. Compared to their baseline counterparts, the experimental modules exhibited higher $J_{sc}$ values (on the order of 20 mA higher). After ten minutes exposure to natural sunlight, the experimental modules exhibited fill factors essentially equal to the baseline counterparts. Thus, the two-layer structures provide modules with powers equal to or greater than the baseline counterparts, with the attendant opportunity for lower manufacturing cost and improved durability.

EXAMPLE 3

Preparation of Solar Cells Comprising a Transparent Conductor Made Hazy by Post-Formation Modification Integrated ZnO/thin CdS/CIS modules of approximately 900 cm$^2$ in size were fabricated, and the modules' I-V responses under simulated sunlight were measured. The modules' initial photocurrent densities were approximately 10% lower than those typical for modules fabricated with hazy ZnO as described in Example 1. The lower photocurrent densities were believed due to relatively high specularity of the asdeposited ZnO films. The modules were then etched in 0.5M oxalic acid for 4 minutes in 2 minute increments to convert a portion of the ZnO layer to hazy zinc oxalate. After etching, the modules were remeasured and exhibited increases of 5-7% in photocurrent and decreases of 1-2% in fill factor. The increase in photocurrent is believed due to an increase in the haze of the transparent conductor stack in accordance with an embodiment of this invention. The decrease in fill factor is believed due to an increase in transparent conductor stack sheet resistance due to the conversion of some of the more-conductive zinc oxide film to less-conductive zinc oxalate. The increase in photocurrent exceeds the losses in other module characteristics, yielding an overall increase in module efficiency as a result of the post-formation modification to provide a hazy film.

While the present invention has been illustrated and described with reference to particular compositions and procedures, it will be apparent that various modifications and changes therein can be made within the scope of the appended claims.

What is claimed is:

1. A photovoltaic device comprising:
   a semiconductor layer comprising a compound semiconductor selected from the group consisting of II/VI, III/V, I/III/VI, and II/IV/V compounds; and
   a transparent conductor layer in contact with the semiconductor layer, wherein said transparent conductor layer comprises hazy ZnO.

2. A photovoltaic device according to claim 1, wherein said transparent conductor layer consists essentially of ZnO.

3. A photovoltaic device according to claim 1, wherein said transparent conductor layer exhibits a haze of at least 5%.

4. A photovoltaic device according to claim 1, wherein said transparent conductor layer comprises a doped zinc oxide composition.

5. A photovoltaic device according to claim 4, wherein said doped zinc oxide composition comprises at least one dopant selected from the group consisting of hydrogen, aluminum, gallium, indium, and boron.

6. A photovoltaic device according to claim 5, wherein said dopant is boron.

7. A photovoltaic device according to claim 6, wherein said boron is derived from $B_2H_6$ as a dopant reactant.

8. A photovoltaic device according to claim 1, wherein said transparent conductor layer is a single layer comprising hazy ZnO.

9. A photovoltaic device according to claim 1, wherein said transparent conductor layer is a single layer comrpising haxy ZnO in which the degree of transparent conductor haze is varied through the thickness of said transparent conductor layer.

10. A photovoltaic device according to claim 1, further comprising at least a second transparent conductor layer differing in at least one property relative to a first transparent conductor layer, said at least one property being selected from the group consisting of electrical properties, optical properties, mechanical properties, and composition.

11. A photovoltaic device according to claim 10, wherein said first transparent conductor layer and said second transparent conductor layer both comprise doped zinc oxide compositions having different concentrations of dopant, different dopants, or both.

12. A photovoltaic device comprising:
a seminconductor layer comprising a I/III/VI compound semiconductor; and
a transparent conductor layer in contact with the semiconductor layer, wherein said transparent conductor layer comprises hazy ZnO.

13. A photovoltaic device according to claim 12, wherien said transparent conductor layer consists essentially of ZnO.

14. A photovoltaic device accordng to claim 12, wherein said transparent conductor layer exhibits a haze of at least 5%.

15. A photovoltaic device according to claim 12, wherein said transparent conductor layer comprises a doped zinc oxide composition.

16. A photovoltaic device according to claim 15, wherein said doped zinc oxide composition comprises at least one dopant selected from the group consisting of hydrogen, aluminum, gallium, indium, and boron.

17. A photovoltaic device according to claim 16, wherein said dopant is boron.

18. A photovoltaic device according to claim 17, wherein said boron is derived from $B_2H_6$ as a dopant reactant.

19. A photovoltaic device according to claim 12, wherein said transparent conductor layer comprises hazy ZnO in which the degree of transparent conductor haze is varied through the thickness of said transparent conductor layer.

20. A photovoltaic device according to claim 12, further comprising at least a second transparent conductor layer differing in at least one property relative to a first transparent conductor layer, said at least one property being selected from the group consisting of electrical properties, optical properties, mechanical properties, and composition.

21. a photovoltaic device according to claim 20, wherein said first transparent conductor layer and said second transparent conductor layer both comprise doped zinc oxide compositions having different concentrations of dopant, differnet dopants, or both.

22. A photovoltaic device according to claim 12, wherein said compound semiconductor comprises a compound of elements selected from the group consisting of Cu, In, Ag, Ga, Al, S, Se, and Te.

23. A photovoltaic device according to claim 12, wherein said I/III/VI compound is selected from the group consisting of copper indium diselenide, copper indium disulfide, copper gallium diselenide, and copper gallium disulfide.

24. A photovoltaic device accoridng. to claim 12, wherein sid I/III/VI compound is copper indium gallium diselenide.

25. A photovoltaic device according to claim 12, wherein said I/III/VI compound is copper indium diselenide.

* * * * *